United States Patent
Kaita et al.

(10) Patent No.: US 10,164,442 B2
(45) Date of Patent: Dec. 25, 2018

(54) BATTERY MONITORING DEVICE

(71) Applicant: TOYOTA JIDOSHA KABUSHIKI KAISHA, Toyota-shi, Aichi-ken (JP)

(72) Inventors: Keiji Kaita, Miyoshi (JP); Hiromasa Tanaka, Okazaki (JP); Takahiro Okada, Toyota (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 149 days.

(21) Appl. No.: 14/986,316

(22) Filed: Dec. 31, 2015

(65) Prior Publication Data

US 2016/0197499 A1 Jul. 7, 2016

(30) Foreign Application Priority Data

Jan. 7, 2015 (JP) ................................. 2015-001883

(51) Int. Cl.
*H02J 7/00* (2006.01)
*B60L 11/18* (2006.01)
(Continued)

(52) U.S. Cl.
CPC .......... *H02J 7/0019* (2013.01); *B60L 3/0046* (2013.01); *B60L 3/0084* (2013.01);
(Continued)

(58) Field of Classification Search
CPC ........ H02J 7/0021; H02J 7/0016; H02J 7/007; H02J 7/0014; H02J 7/0052; H02J 7/0019; H02J 7/0054; H02J 7/0047; H02J 7/0068
See application file for complete search history.

(56) References Cited

U.S. PATENT DOCUMENTS

2010/0019724 A1* 1/2010 Mizutani ............. H01M 10/425
320/118
2010/0033128 A1 2/2010 Densham et al.
(Continued)

FOREIGN PATENT DOCUMENTS

JP 2000252803 A 9/2000
JP 2007-300701 A 11/2007
(Continued)

OTHER PUBLICATIONS

Communication, dated May 13, 2016, from the European Patent Office in counterpart European application No. 15202836.1.

Primary Examiner — Drew A Dunn
Assistant Examiner — Sailesh Thapa
(74) Attorney, Agent, or Firm — Sughrue Mion, PLLC

(57) ABSTRACT

A battery monitoring device monitoring a battery unit connecting battery blocks, the battery unit being configured by each of the battery blocks connecting battery cells, includes: a voltage detection circuit connected to each of the plurality of battery cells via a voltage detection line; a first equalization circuit as a circuit provided with at least a first switching element, the first equalization circuit being disposed for each of the battery cells and connected to the corresponding battery cell; a resistor element disposed on the voltage detection line; a second equalization circuit as a circuit provided with at least a second switching element, the second equalization circuit being disposed for each of the battery blocks and connected to the corresponding battery block; and a controller configured to control driving of the switching elements. The second equalization circuit is connected further on the battery block side than the resistor element.

5 Claims, 8 Drawing Sheets

(51) Int. Cl.
  *H01M 10/48*   (2006.01)
  *B60L 3/00*   (2006.01)
  *G01R 31/327*   (2006.01)
  *H01M 10/42*   (2006.01)

(52) U.S. Cl.
  CPC ....... *B60L 11/1866* (2013.01); *H01M 10/482* (2013.01); *H02J 7/0016* (2013.01); *H02J 7/0021* (2013.01); *H02J 7/0029* (2013.01); *B60L 2240/547* (2013.01); *G01R 31/327* (2013.01); *H01M 2010/4271* (2013.01); *H01M 2220/20* (2013.01); *H02J 2007/0039* (2013.01); *Y02T 10/7005* (2013.01); *Y02T 10/7061* (2013.01)

(56) References Cited

U.S. PATENT DOCUMENTS

2012/0268079 A1* 10/2012 Nakamura ............ H02J 7/0031
  320/166
2014/0111160 A1* 4/2014 Nozawa ............... G01R 31/362
  320/118
2015/0035487 A1* 2/2015 Kawamoto ........... H02J 7/0016
  320/112
2015/0229143 A1* 8/2015 Kaita ................... H02J 7/0021
  320/118

FOREIGN PATENT DOCUMENTS

| | | | |
|---|---|---|---|
| JP | 2007300701 | * | 11/2007 |
| JP | 4029351 B2 | | 1/2008 |
| JP | 2010029050 A | | 2/2010 |
| JP | 2010142039 | * | 6/2010 |
| JP | 2010142039 A | | 6/2010 |
| JP | 2010-187534 A | | 8/2010 |
| JP | 2014-143853 A | | 8/2014 |
| JP | 2015223008 | * | 12/2015 |
| WO | 2014/045567 A1 | | 3/2014 |

* cited by examiner

F I G . 5
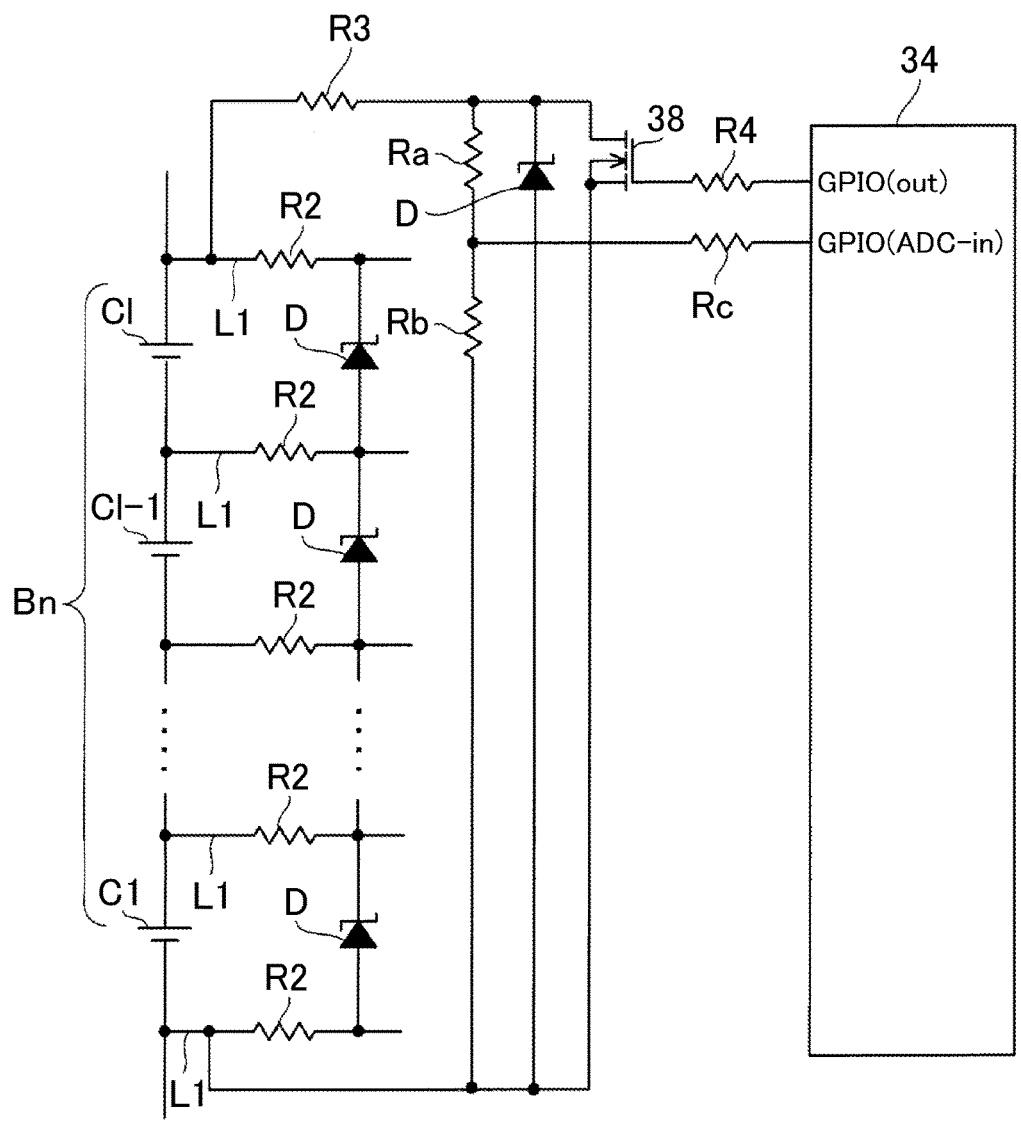

BATTERY MONITORING DEVICE

INCORPORATION BY REFERENCE

The disclosure of Japanese Patent Application No. 2015-001883 filed on Jan. 7, 2015 including the specification, drawings and abstract is incorporated herein by reference in its entirety.

BACKGROUND OF THE INVENTION

1. Field of the Invention

The invention relates to a battery monitoring device that monitors a battery unit which connects a plurality of battery blocks in series to each other.

2. Description of Related Art

A battery unit for supplying electric power to a motor, which is a power source, is mounted in a hybrid vehicle or an electric car. A plurality of battery blocks that are connected in series to each other constitute the battery unit, and a plurality of battery cells that are connected in series to each other constitute each of the battery blocks. Each of the battery cells is a secondary battery such as a nickel-hydrogen battery and a lithium-ion battery. Capacities, internal resistances, self-discharge amounts, and the like of the respective battery cells are subjected to variations, and voltages of the respective battery cells are subjected to variation attributable to the above-described variations. In the event of the voltage variation, deterioration of the battery cells is accelerated or the amount of available energy is reduced. An equalization circuit that equalizes battery characteristics between the battery cells in order to remove the voltage variations of the respective battery cells has been proposed (for example, refer to Japanese Patent Application Publication No. 2010-187534 (JP 2010-187534 A) and Japanese Patent Application Publication No. 2014-143853 (JP 2014-143853 A)).

The equalization circuit monitors an output voltage from each of the battery cells. When a battery cell with a high voltage is detected, the equalization circuit attempts to equalize the battery characteristics between the battery cells by performing discharging from that battery cell. In general, the equalization circuit is a circuit that directly connects a switching element and a resistor element to each other, and the corresponding battery cell is discharged when the switching element is turned ON and a current is allowed to flow through the equalization circuit. The equalization circuit, eventually the switching element, is disposed for each of the battery cells and makes an attempt at the equalization by battery cell (for example, refer to JP 2010-187534 A and JP 2014-143853 A).

In recent years, an absolute amount of a variation in the self-discharge amounts of the battery cells is on the increase due to an increase in battery capacity, and a discharge current that is required for the equalization is on the increase as well. In this case, problems arise such as an increase in size, an increase in layout complexity, and an increase in cost regarding the battery monitoring device. For example, in general battery monitoring devices, an IC that outputs an electrical signal for ON/OFF switching to each of the switching elements is disposed for each of the battery blocks. In some cases, the switching element that constitutes the equalization circuit being built into the IC has been proposed. However, when the discharge current for the equalization increases, a heating value of the built-in switching element increases as well, and thus the IC is subjected to an increase in size and cost. In this regard, a configuration for using an external switching element with a large current capacity instead of the switching element built into the IC has been proposed. In this case, however, the external switching element should be prepared for and placed in each of the battery cells. Accordingly, problems arise in the form of an increase in the number of components and an increase in substrate component layout complexity, which, in turn, results in an increase in cost. It is also conceivable that an inter-battery block voltage variation is removed with the equalization circuit being disposed for each of the battery blocks. In other words, it is conceivable that an equalization circuit connected in parallel to the battery block is disposed. In this case, however, an effect attributable to a voltage effect occurs in the event of an equalization circuit control (the switching element of the equalization circuit becoming ON) during battery cell voltage detection depending on equalization circuit connection positions. Accordingly, a problem arises in the form of an inaccurate voltage detection. In other words, the battery cell voltage detection and the battery block equalization control cannot be performed at the same time in some cases.

SUMMARY OF THE INVENTION

The invention provides a battery monitoring device that is capable of suppressing an increase in cost and size, equalizing a plurality of battery cells, and performing an accurate voltage detection even in the event of an increase in a variation in self-discharge amount.

According to an aspect of the invention, there is provided a battery monitoring device monitoring a battery unit connecting a plurality of battery blocks in series to each other and configured by each of the battery blocks connecting a plurality of battery cells in series to each other. The battery monitoring device includes a voltage detection circuit connected to each of the plurality of battery cells via a voltage detection line and detecting a voltage of the battery cell, a first equalization circuit as a circuit provided with at least a first switching element, the first equalization circuit being disposed for each of the plurality of battery cells and connected in parallel to the corresponding battery cell so as to equalize the respective voltages of the plurality of battery cells, a resistor element for overcurrent prevention disposed on the voltage detection line, a second equalization circuit as a circuit provided with at least a second switching element, the second equalization circuit being disposed for each of the plurality of battery blocks and connected in parallel to the corresponding battery block so as to equalize respective voltages of the plurality of battery blocks, and a controller controlling driving of the first and second switching elements, in which the second equalization circuit is connected further on the battery block side than the resistor element for overcurrent prevention.

The battery monitoring device according to the aspect described above may further include an IC disposed for each of the battery blocks and having the voltage-dividing circuit built thereinto, in which the second switching element may be an external switching element attached outside the IC. In addition, the first switching element may be a built-in switching element built into the IC.

The battery monitoring device according to the aspect described above may further include a voltage-dividing circuit connected in parallel to the second switching element and taking out a voltage value proportional to a both-end voltage of the second switching element, in which the controller may determine a presence or absence of a failure of the second switching element based on the voltage value taken out by the voltage-dividing circuit.

The battery monitoring device according to the aspect described above may further include a detection circuit including a third switching element turn ON by a current flowing through the second switching element, in which the controller may determine a presence or absence of a failure of the second switching element based on a voltage output from the detection circuit.

According to the aspect of the invention described above, the second equalization circuit equalizing the voltage of each of the battery blocks is disposed for each of the battery blocks, and thus an equalization current flowing through the first equalization circuit can be suppressed to a low level and an increase in a variation in self-discharge amount can be sufficiently dealt with. Since the second equalization circuit is connected further on the battery block side than the resistor element for overcurrent prevention, a block equalization processing and a voltage detection processing can be performed at the same time. As a result, the plurality of battery cells can be equalized and voltage detection can be accurately performed while an increase in cost and an increase in size are suppressed despite an increase in the variation in the self-discharge amount.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 5 is a drawing illustrating an example of a failure detection configuration of a second FET;

DETAILED DESCRIPTION OF EMBODIMENTS

Figure 1:
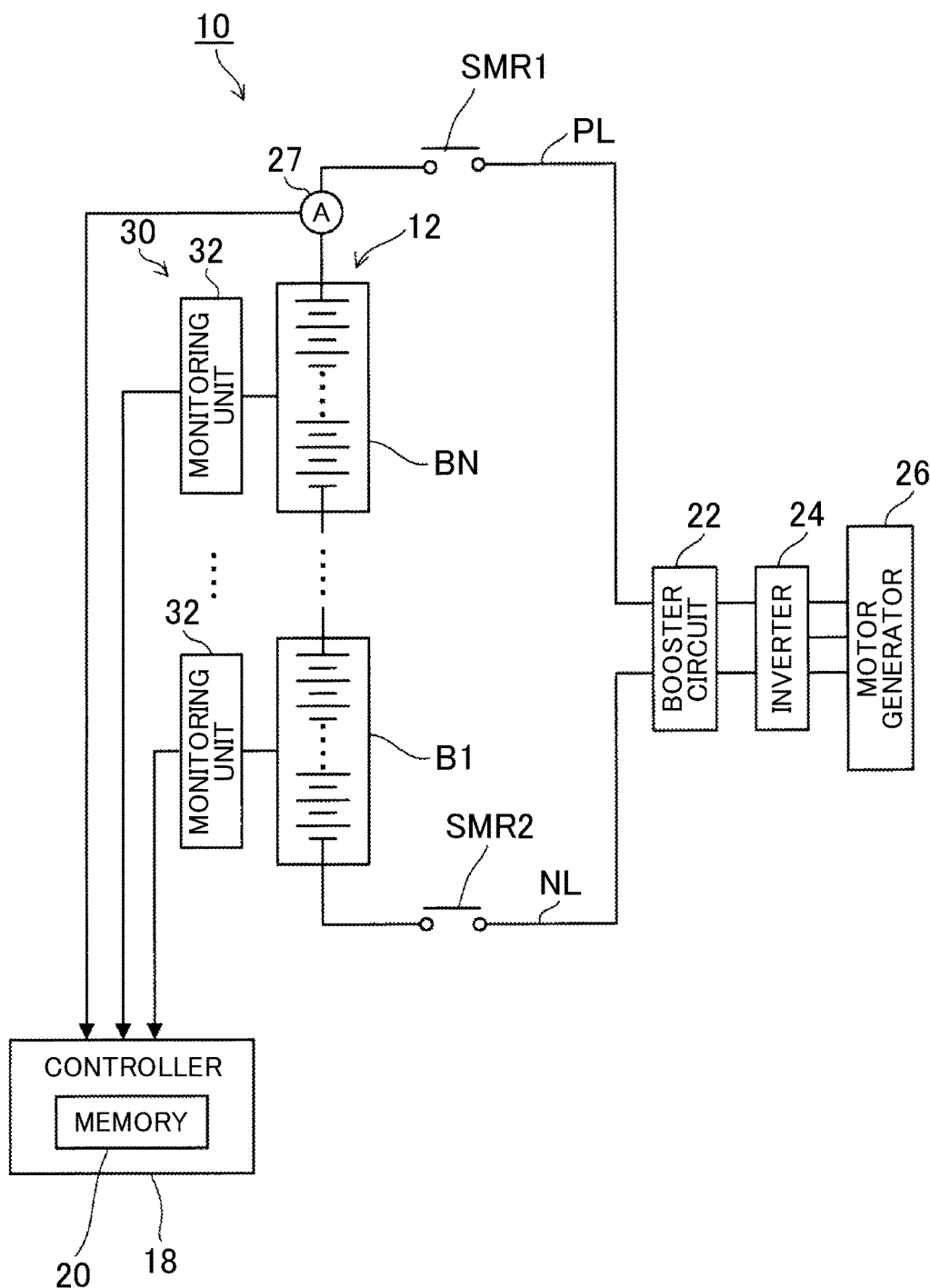
FIG. 1 is a drawing illustrating a configuration of a battery system according to an embodiment of the invention.
Figure 2:
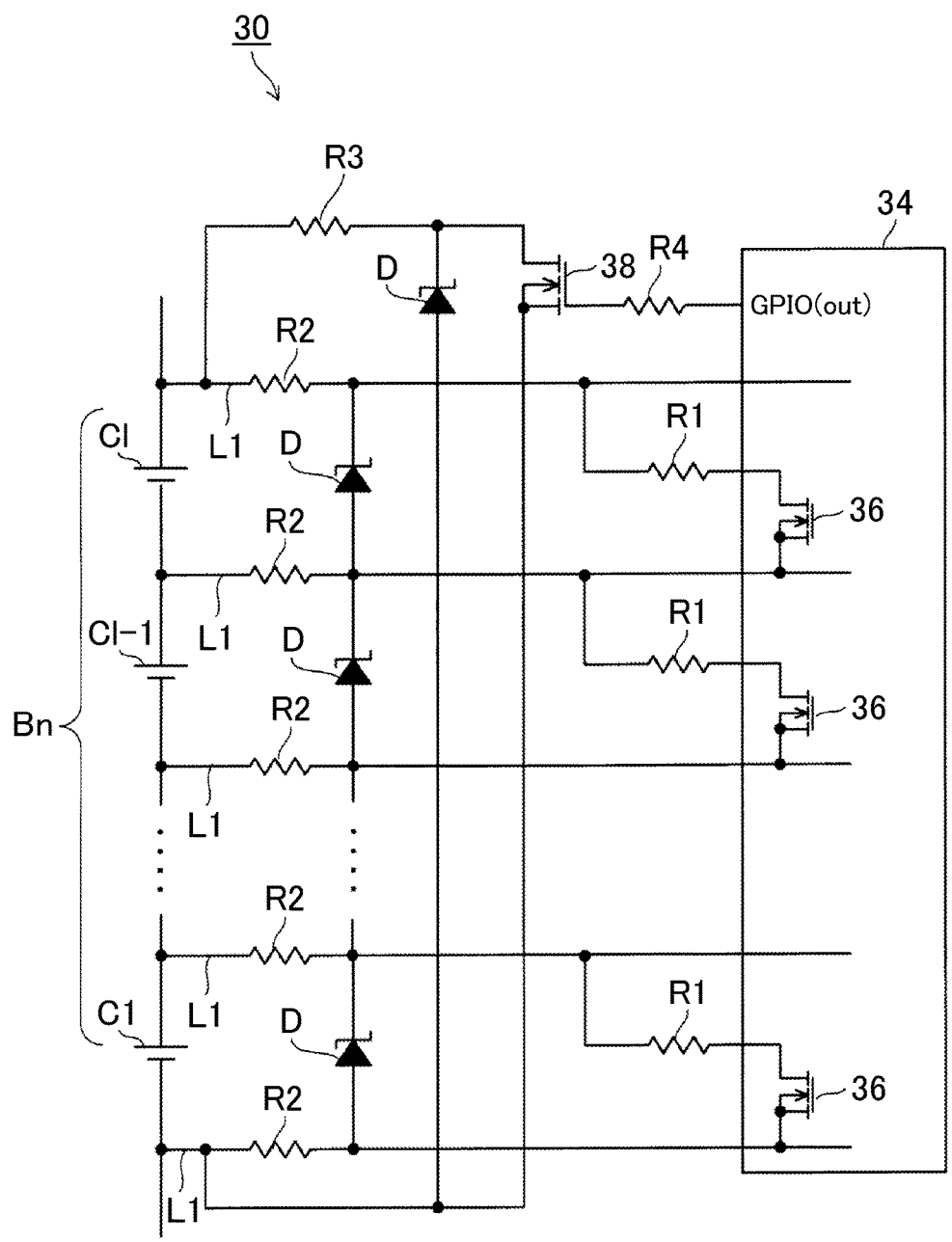
FIG. 2 is a drawing illustrating configurations of a battery unit and a monitoring unit.

Hereinafter, an embodiment of the invention will be described with reference to accompanying drawings. FIG. 1 is a schematic drawing illustrating a configuration of a battery system 10 according to the embodiment of the invention. FIG. 2 is a circuit diagram of a battery monitoring device 30.

The battery system 10 that is illustrated in FIG. 1 can be mounted in a vehicle. Examples of this vehicle include an electric vehicle such as an electric car and a hybrid car. The electric car is a vehicle in which a battery unit 12 (described later) is provided as a vehicle power source. The hybrid car is a vehicle that is provided with a fuel cell, an engine, or the like in addition to the battery unit 12 (described later) as a power source for traveling the vehicle. In the hybrid car, the battery unit 12 can be charged with electric power from an external electric power supply. The external electric power supply is an electric power supply that is placed outside the vehicle (such as a commercial electric power supply).

A positive electrode line PL is connected to a positive electrode terminal of the battery unit 12. A system main relay SMR1 is disposed on the positive electrode line PL. A negative electrode line NL is connected to a negative electrode terminal of the battery unit 12. A system main relay SMR2 is disposed on the negative electrode line NL. The system main relays SMR1, SMR2 are switched between ON and OFF by receiving a control signal from a controller 18. The controller 18 can connect the battery unit 12 to a load (a booster circuit 22 (described later)) by switching the system main relays SMR1, SMR2 from OFF to ON.

A current sensor 27 detects a value Ib of a current flowing through the battery unit 12 and outputs a result of the detection to the controller 18. In this example, a positive value is used as the current value Ib when the battery unit 12 is discharged and a negative value is used as the current value Ib when the battery unit 12 is charged. In this example, the current sensor 27 is disposed on the positive electrode line PL. However, the invention is not limited thereto insofar as the current sensor 27 can detect the value Ib of the current flowing through the battery unit 12. For example, the current sensor 27 can be disposed on at least one of the positive electrode line PL and the negative electrode line NL. In addition, a plurality of the current sensors 27 can be disposed on one of the positive electrode line PL and the negative electrode line NL.

The battery unit 12 is connected to the booster circuit 22 via the positive electrode line PL and the negative electrode line NL. The booster circuit 22 boosts an output voltage of the battery unit 12 and outputs electric power after the boosting to an inverter 24. The inverter 24 converts DC electric power output from the booster circuit 22 to AC electric power and outputs the AC electric power to a motor generator 26. The motor generator 26 generates kinetic energy for traveling the vehicle by receiving the AC electric power from the inverter 24. The vehicle is allowed to travel when the kinetic energy that is generated by the motor generator 26 is transmitted to a vehicle wheel.

When the vehicle is decelerated and when the vehicle is stopped, the motor generator 26 converts kinetic energy generated during braking of the vehicle to electrical energy (AC electric power). When the vehicle travels downhill, the motor generator 26 converts kinetic energy to electrical energy so as to generate a braking force. The AC electric power that is generated by the motor generator 26 is converted into DC electric power by the inverter 24. In addition, the booster circuit 22 steps down an output voltage of the inverter 24 and supplies electric power after the step-down to the battery unit 12. In this manner, regenerative electric power can be stored in the battery unit 12.

The controller 18 has a memory 20. The memory 20 stores information used when the controller 18 performs specific processing. In this embodiment, the memory 20 is built into the controller 18. However, the memory 20 may be disposed outside the controller 18 as well.

Information relating to ON/OFF of an ignition switch of the vehicle is input to the controller 18. When the ignition switch is switched from OFF to ON, the controller 18 connects the battery unit 12 and the booster circuit 22 to each other by switching the system main relays SMR1, SMR2 from OFF to ON. In this manner, the battery system 10 that is illustrated in FIG. 1 is put into a starting state (ready-ON).

When the ignition switch is switched from ON to OFF, the controller 18 cuts off the connection between the battery unit 12 and the booster circuit 22 by switching the system main relays SMR1, SMR2 from ON to OFF. In this manner, the battery system 10 that is illustrated in FIG. 1 is put into a stationary state (ready-OFF).

The battery unit 12 is configured by connecting a plurality of battery blocks Bn (n=1, 2, . . . , N) in series. Each of the battery blocks Bn is configured by connecting a plurality of battery cells Ci (i=1, 2, . . . , I) in series. The number of the battery blocks Bn that constitute the battery unit 12 and the number of the battery cells Ci that constitute each of the battery blocks Bn can be appropriately set based on a required output of the battery unit 12 or the like. A secondary battery such as a nickel-hydrogen battery and a lithium-ion battery can be used as the battery cell Ci. In addition, an electric double layer capacitor can be used instead of the secondary battery.

A voltage of the battery unit 12 or the like is monitored by the battery monitoring device 30 and controlled. A plurality of battery monitoring units 32 constitute the battery monitoring device 30, and the battery monitoring units 32 are disposed for the respective battery blocks Bn. FIG. 2 is a diagram illustrating configurations of the battery monitoring units 32 and the battery blocks Bn.

The battery monitoring units 32 are provided with ICs 34 that are disposed for the respective battery blocks Bn, first equalization circuits that equalize a voltage value variation between the battery cells Ci, and second equalization circuits that equalize a voltage value variation between the battery blocks Bn.

The IC 34 is an integrated circuit that functions as a voltage detection circuit and constitutes a part of the first equalization circuit. Gate drive circuits of first and second FETs 36, 38 (described later) are built into the ICs 34. The first and second FETs 36, 38 are turned ON or OFF in accordance with a control signal from the controller 18. In addition, a voltage detection line L1 is connected to each of a positive electrode terminal and a negative electrode terminal of each of the battery cells Ci. Each of the voltage detection lines L1 is connected to an input channel of the IC 34. The voltage detection circuit that is connected to the voltage detection line L1 is formed in the IC 34. The voltage detection circuit is configured to have, for example, a capacitor that is connected in parallel to the corresponding battery cell Ci and a comparator that is connected to each of the voltage detection lines L1 via a sampling switch. In the case of this voltage detection circuit, a voltage value of the battery cell Ci (voltage value of the corresponding capacitor) is output from the comparator when the sampling switch with respect to the battery cell Ci that is to be detected is turned ON. The voltage value that is output from the voltage detection circuit is input to the controller 18 after A/D conversion.

The first equalization circuit is a circuit that equalizes the voltage value variation between the battery cells Ci. The battery cells Ci have varying self-discharge amounts, and the variation occurs between the voltage values of the respective battery cells Ci (cell voltage values) due to the varying self-discharge amounts. In the event of the cell voltage value variation, deterioration of the battery cells Ci is accelerated or the amount of available energy is reduced. The first equalization circuit, which lowers the voltage value of a specific one of the battery cells Ci by discharging the specific battery cell Ci if necessary, is disposed such that the above-described is avoided. The first equalization circuit is disposed for each of the battery cells Ci. The first equalization circuit is a circuit that connects a resistor element R1 and the first FET 36, which is a switching element, in series to each other. This first equalization circuit is connected in parallel to the corresponding battery cell Ci. In this embodiment, the first FET 36 is a built-in FET that is formed in the IC 34.

When the voltage value of the specific battery cell Ci is higher than the voltage value of the other battery cell Ci, the controller 18 discharges the specific battery cell Ci by switching the first FET 36 that is connected in parallel to the specific battery cell Ci from OFF to ON. When the first FET 36 is turned ON, a discharge current of the specific battery cell Ci is allowed to flow through the resistor element R1 and the voltage value of the specific battery cell Ci can be reduced. When this discharge treatment is performed on all the battery cells Ci that have at least a certain cell voltage value, the voltage values of the plurality of battery cells Ci can be equalized. In the following description, a processing for aligning the voltage value variation of the plurality of battery cells Ci included in the same battery block Bn will be referred to as a "cell equalization processing".

On each of the voltage detection lines L1, a resistor element R2 for overcurrent prevention is disposed between the battery cell Ci and the first equalization circuit. The resistor element R2 for overcurrent prevention is opened when a current exceeding an allowable current value flows. Then, electrical connection between the battery monitoring unit 32 and the battery unit 12 is cut off, and a flow of an excessive current from the battery unit 12 (battery cell Ci) to the battery monitoring unit 32 can be suppressed.

Zener diodes D are connected in parallel to the respective battery cells Ci via the voltage detection lines L1. Cathodes of the zener diodes D are connected to the positive electrode terminals of the battery cells Ci, and anodes of the zener diodes D are connected to the negative electrode terminals of the battery cells Ci. The zener diodes D are used so that an overvoltage application from the battery unit 12 to the battery monitoring units 32 is suppressed. In the event of the overvoltage application from the battery unit 12 to the battery monitoring units 32, currents flow through the zener diodes D, and then the overvoltage application to the battery monitoring units 32 is suppressed. The plurality of zener diodes D are electrically connected in series to each other.

The second equalization circuit is a circuit that equalizes a voltage value (block voltage value) variation of the battery blocks Bn. This second equalization circuit is disposed for each of the battery blocks Bn. The second equalization circuit is a circuit that connects a resistor element R3 and the second FET 38, which is a switching element, in series to each other. This second equalization circuit is connected in parallel to the corresponding battery block Bn. In this embodiment, the second FET 38 is an external FET that is disposed outside the IC 34. As illustrated in FIG. 2, the second equalization circuit is connected further on the battery block Bn side than the resistor element R2 for overcurrent prevention.

When the voltage value of a specific one of the battery blocks Bn is higher than the voltage value of the other battery block Bn, the controller 18 discharges the specific battery block Bn by switching the second FET 38 that is connected in parallel to the specific battery block Bn from OFF to ON. When the second FET 38 is turned ON, a discharge current of the specific battery block Bn is allowed to flow through the resistor element R3 and the voltage value of the specific battery block Bn can be reduced. When this discharge treatment is performed on all the battery blocks Bn that have a high block voltage value, the voltage values of the plurality of battery blocks Bn can be equalized. In the following description, a processing for aligning the voltage value variation between the battery blocks Bn will be referred to as a "block equalization processing".

The second equalization circuit is disposed for the following reason. As described above, the voltage value variation between the battery cells Ci is equalized by the first equalization circuit. However, in recent years, a battery capacity of the battery unit 12 as a whole is on the increase so that a demand for an increased electric vehicle cruising distance is met. In this case, an absolute amount of the amount of variation in self-battery discharge increases as well, and thus an increase in current flowing through the equalization circuit for the equalization processing (equalization current) is required.

The voltage value variation in the battery unit 12 includes not only the voltage value variation between the plurality of battery cells Ci that constitute the same battery block Bn but also the voltage value variation between the plurality of battery blocks Bn that constitute the same battery unit 12. The voltage value variation between the battery cells Ci in the same battery block Bn occurs mainly due to the varying self-discharge amounts of the battery cells Ci. The voltage value variation between the battery blocks Bn occurs due to varying current consumptions by the ICs 34 connected to the respective battery blocks Bn as well as the varying self-discharge amounts of the battery cells Ci. When the voltage value variation between the battery blocks Bn is to be removed with the first equalization circuit alone, the equalization current that flows through the first FET 36 should be increased.

However, a heating value of the first FET 36 increases when the equalization current that flows through the first FET 36 which is built into the IC 34 is increased. As a result, problems arise with the IC 34 itself being increased in size and component costs increasing as well. It is conceivable to use an external FET, instead of an FET built into the IC, as the first FET 36 so that the problem is avoided. In a case where the first FET 36 is an external FET, however, the component (external FET) should be disposed for each of the battery cells Ci, and then another problem arises in the form of an increase in the number of components. In addition, an expensive multi-layer substrate needs to be adopted and an increase in component costs ensues for as many external FETs as the battery cells Ci to be mounted on a substrate which has a limited size.

In this embodiment, the second equalization circuit is disposed in this regard and the voltage value variation between the battery blocks Bn is removed by the second equalization circuit. The switching element of the second equalization circuit is an external FET as described above, and thus has a large allowable energization amount. In addition, only one second FET 38 is disposed in one battery block Bn. Accordingly, problems such as an increase in the number of components and an increase in component layout complexity can be effectively prevented.

In this embodiment, the second equalization circuit is connected further on the battery block Bn side than the resistor element R2 for overcurrent prevention. In the case of this configuration, the voltage detection line L1 is subjected to no voltage drop, and thus the cell voltage value can be accurately detected even while the second FET 38 is ON. From another point of view, the block equalization processing can be executed at all times, regardless of whether the cell voltage value detection is in progress or not, in this embodiment.

Figure 3:
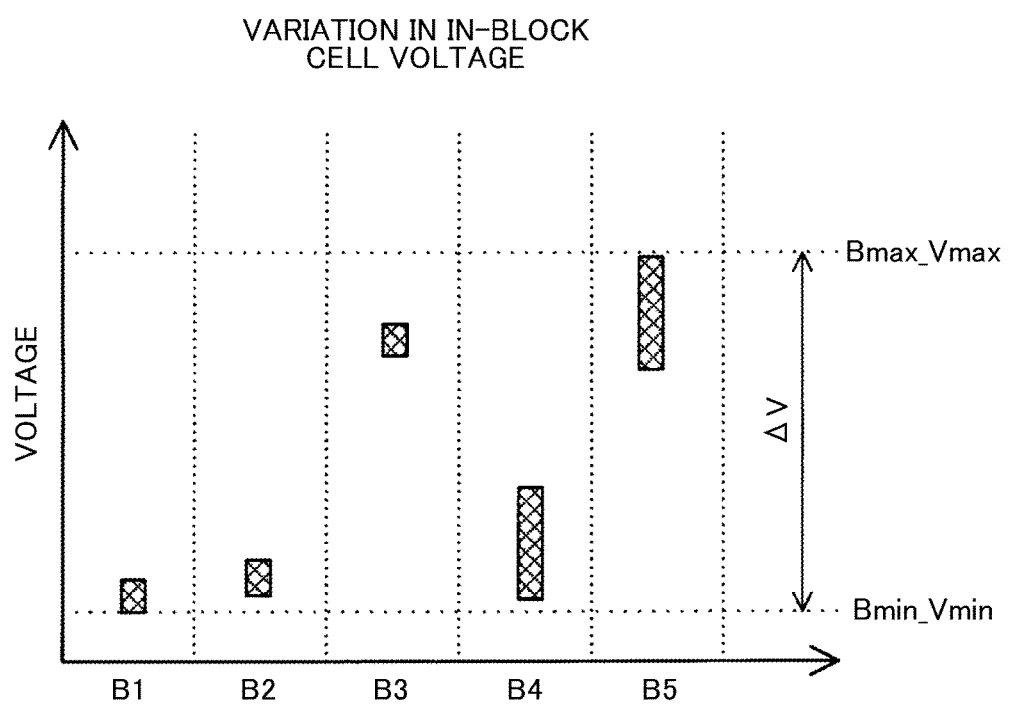
FIG. 3 is a drawing illustrating an example of a cell voltage variation.

A flow of the equalization processing in the battery monitoring device 30 will be described below. FIG. 3 is a drawing illustrating an example of the cell voltage value variation in one of the battery blocks Bn. In the example that is illustrated in FIG. 3, five battery blocks B1 to B5 constitute the single battery unit 12. Of the voltages of the plurality of battery cells Ci that are included in the same battery block Bn, the minimum cell voltage will be referred to as an "in-block minimum voltage Bn_Vmin" and the maximum cell voltage will be referred to as an "in-block maximum voltage Bn_Vmax". Of the voltages of all the battery cells Ci included in the same battery unit 12, the minimum cell voltage will be referred to as an "in-unit minimum voltage Bmin_Vmin" and the maximum cell voltage will be referred to as an "in-unit maximum voltage Bmax_Vmax". The battery blocks Bn that have the battery cells Ci which have these minimum and maximum cell voltages will be referred to as a "minimum voltage block Bmin" and a "maximum voltage block Bmax".

In the example that is illustrated in FIG. 3, the battery block B1 is the minimum voltage block Bmin, and the in-block minimum voltage B1_Vmin of the battery block B1 is the in-unit minimum voltage Bmin_Vmin. In addition, the battery block B5 is the maximum voltage block Bmax, and the in-block maximum voltage B5_Vmax of the battery block B5 is the in-unit maximum voltage Bmax_Vmax.

In the first stage of the equalization processing, the voltages of the respective battery cells Ci are detected. Then, in a case where the voltage variation between the battery blocks Bn is at a high level, the block equalization processing by the second equalization circuit is performed. More specifically, the second FET 38 of the second equalization circuit that corresponds to the battery block Bn in which the in-block minimum voltage Bn_Vmin exceeds the in-unit minimum voltage Bmin_Vmin is turned ON and the block voltage value is lowered. In the example that is illustrated in FIG. 3, the battery blocks B3, B5 have an in-cell minimum voltage exceeding the in-unit minimum voltage Bmin_Vmin. Accordingly, the second FETs 38 of the second equalization circuits connected to the battery blocks B3, B5 are turned ON and the block voltage values of the battery blocks B3, B5 are lowered.

In a case where the cell voltage value variation in the single battery block Bn is at a high level, the cell equalization processing by the first equalization circuit is performed. More specifically, the first FET 36 of the first equalization circuit that corresponds to the battery cell Ci which has a cell voltage Bn_Vi exceeding the in-cell minimum voltage Bn_Vmin is turned ON and the cell voltage value is lowered. In the example that is illustrated in FIG. 3, the battery blocks B1, B2, B3 have a low level of cell voltage variation in the battery blocks Bn, and thus the cell equalization processing in the battery blocks B1, B2, B3 is unnecessary. Meanwhile, the battery blocks B4, B5 have a high level of cell voltage value variation in the battery blocks Bn, and thus the cell equalization processing in the battery blocks B4, B5 is executed.

Figure 4:
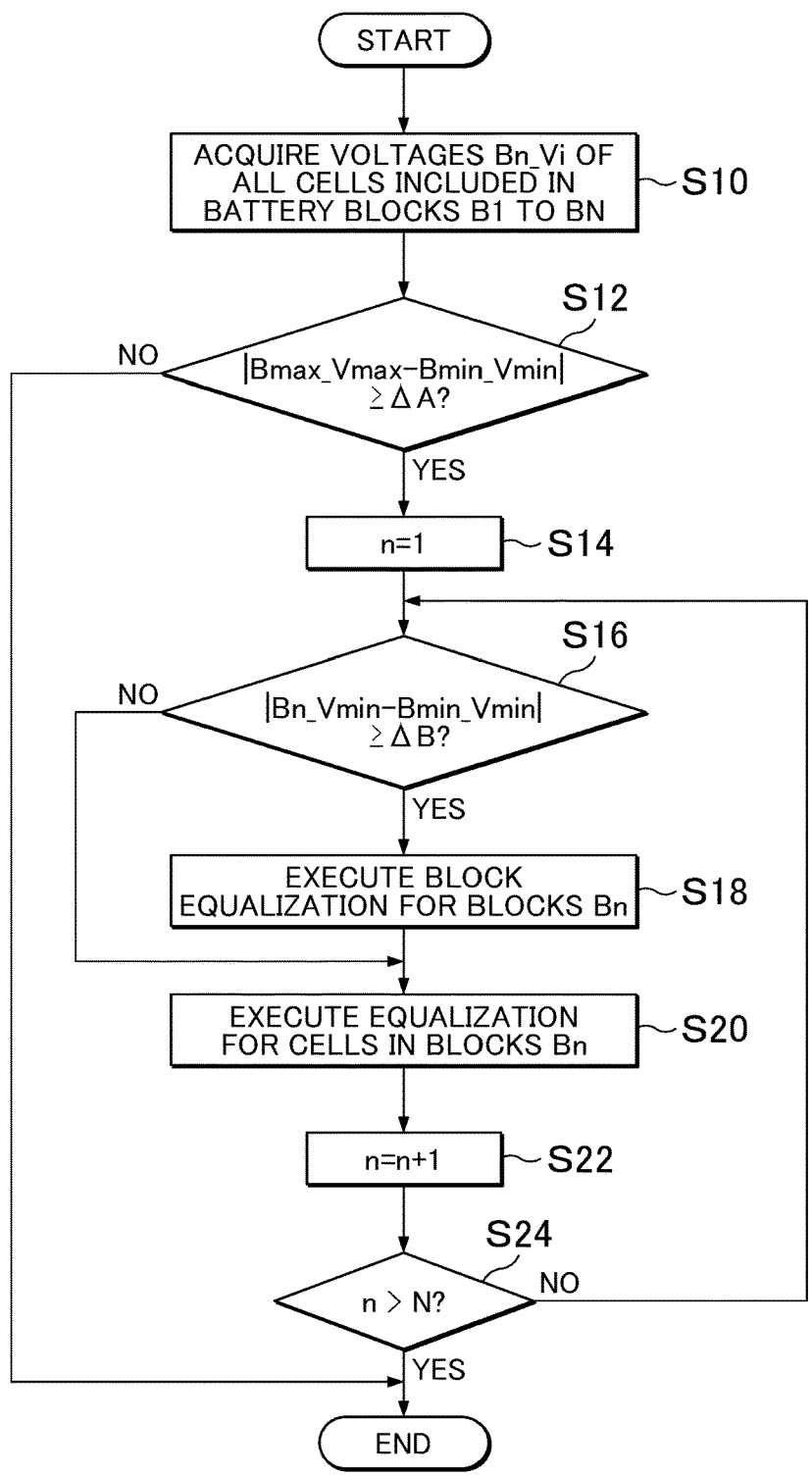
FIG. 4 is a flowchart illustrating a flow of an equalization processing.

FIG. 4 is a flowchart illustrating the flow of the equalization processing. As described above, in the case of this equalization processing, the voltages Bn_Vi of all the battery cells Ci included in all the battery blocks B1 to BN (N being the number of the battery blocks constituting the battery unit 12) are acquired (S10).

Then, it is determined whether or not a deviation $\Delta V$ between the maximum voltage (that is, the in-unit maximum voltage Bmax_Vmax) and the minimum voltage (that is, the in-unit minimum voltage Bmin_Vmin) of all the cell voltages Bn_Vi is at least a specified threshold $\Delta A$ (S12). This threshold $\Delta A$ is a value at which the voltage values of all the battery cells Ci are considered to be equalized. The threshold $\Delta A$ is set based on the battery capacity of the battery unit 12.

In a case where the deviation $\Delta V$ is below the threshold $\Delta A$, the voltage values of all the battery cells Ci are considered to be almost equal. Accordingly, the processing is terminated without the equalization processing being performed. In a case where the deviation $\Delta V$ is at least the threshold $\Delta A$, the voltage values are considered to have a variation, and thus the equalization processing is performed. Specifically, it is first determined whether or not a deviation $\Delta V$min between the in-block minimum voltage Bn_Vmin and the in-unit minimum voltage Bmin_Vmin of the battery block Bn is at least a specified threshold $\Delta B$ (S16). The threshold $\Delta B$ is a value at which all the battery blocks Bn are considered to be equalized. The threshold $\Delta B$ is set based on the battery capacity of the battery unit 12, the amount of the variation in the current consumptions by the ICs 34, the allowable energization amounts of the respective FETs, and the like. The threshold $\Delta B$ is usually higher than the threshold $\Delta A$.

In a case where the deviation $\Delta V$min is at least the specified threshold $\Delta B$, the block equalization processing for the corresponding battery block Bn is executed (S18). This is performed by the second FET 38 corresponding to the battery block Bn remaining ON until the deviation $\Delta V$min becomes less than the threshold $\Delta B$. In this case, the second FET 38 can allow a flow of a relatively large current since the second FET 38 is an external FET. Accordingly, even a relatively high level of inter-block voltage value variation (deviation $\Delta V$min) can also be efficiently removed.

The processing proceeds to Step S20 in a case where the block equalization is completed and in a case where the deviation $\Delta V$min is below the threshold $\Delta B$. In Step S20, the equalization processing for the battery cells Ci in the battery block Bn is performed. A known prior-art technique can be applied to this cell equalization processing in the battery block Bn. For example, the cell equalization processing can be performed by it being determined whether or not a deviation $\Delta V$c with respect to the in-block minimum voltage Bn_Bmin of the battery cell Ci constituting the battery block Bn is at least a specified threshold $\Delta C$ and the first FET 36 corresponding to the battery cell Ci in which the deviation $\Delta V$c is at least the threshold $\Delta C$ becoming ON. As described above, the first equalization circuit may be capable of removing the cell voltage value variation in merely one battery block Bn. The amount of the voltage value variation in this single battery block Bn is smaller than the amount of the voltage value variation between the battery blocks Bn (deviation $\Delta V$min) in many cases, and the equalization current flowing through the first equalization circuit may be relatively small. Accordingly, the first FET 36 can be a built-in FET with a small allowable energization amount.

After the cell equalization processing is terminated, the controller 18 determines whether or not the equalization processing is terminated with respect to all the battery blocks Bn (S24). Then, the equalization processing is terminated provided that the processing of Steps S16 to S22 can be performed on all the battery blocks Bn.

As is apparent from the above description, in this embodiment, the second equalization circuit disposed for each of the battery blocks Bn as well as the first equalization circuit disposed for each of the battery cells Ci is disposed. In addition, the switching element that is disposed in the second equalization circuit is an external FET. With this configuration, the equalization current that flows through the second equalization circuit can be increased and the equalization current that flows through the first equalization circuit can be suppressed to a low level. As a result, the switching element that is disposed in the first equalization circuit can be a switching element built into the IC 34, and thus the number of components can be reduced along with costs.

In addition, in this embodiment, the second equalization circuit is connected further on the battery block Bn side than the resistor element R2 for overcurrent prevention. In this case, the voltage detection line L1 is subjected to no voltage drop, and thus the block equalization processing and the cell voltage value detection can be performed at the same time.

In this embodiment, the FET is used as the switching element. However, a switching signal other than the FET, such as a bipolar transistor and an IGBT, may also be used insofar as it can be switched ON/OFF in accordance with a control signal from the controller 18. In this embodiment, the switching element of the first equalization circuit (the first FET 36) is a switching element built into the IC. However, the first switching element may be either a built-in switching element or an external switching element insofar as the switching element of the second equalization circuit is an external switching element.

In this embodiment, an ON failure•leak failure of the second FET 38 is not detected. If necessary, however, a configuration for detecting the failure of the second FET 38 may be added. Hereinafter, an example of the configuration for detecting the failure of the second FET 38 will be described.

FIG. 5 is a drawing illustrating an example of a failure detection circuit of the second FET 38. The failure detection circuit is incorporated into the second equalization circuit. The failure detection circuit is a circuit that is connected in parallel to the second FET 38. The failure detection circuit is a voltage-dividing circuit that connects two voltage-dividing resistors Ra, Rb in series to each other. The voltage-dividing circuit has a voltage-dividing ratio adjusted such that the block voltage value is voltage-divided to 5 V. An intermediate connection point of the two voltage-dividing resistors Ra, Rb is connected to an input terminal of an A/D converter disposed in the IC 34 via a resistor element Rc. The IC 34 outputs a voltage value Vcheck taken out from the voltage-dividing circuit to the controller 18.

A voltage that is proportional to a both-end voltage (voltage between an emitter and a collector) of the second FET 38 is output from the failure detection circuit which is configured as described above. More specifically, 5 V and 0 V are output by the failure detection circuit in a case where the second FET 38 is ON and in a case where the second FET 38 is OFF, respectively. Based on the output voltage value Vcheck, the controller 18 determines the presence or absence of the ON failure sticking when the second FET 38 is in an ON state.

Figure 6:
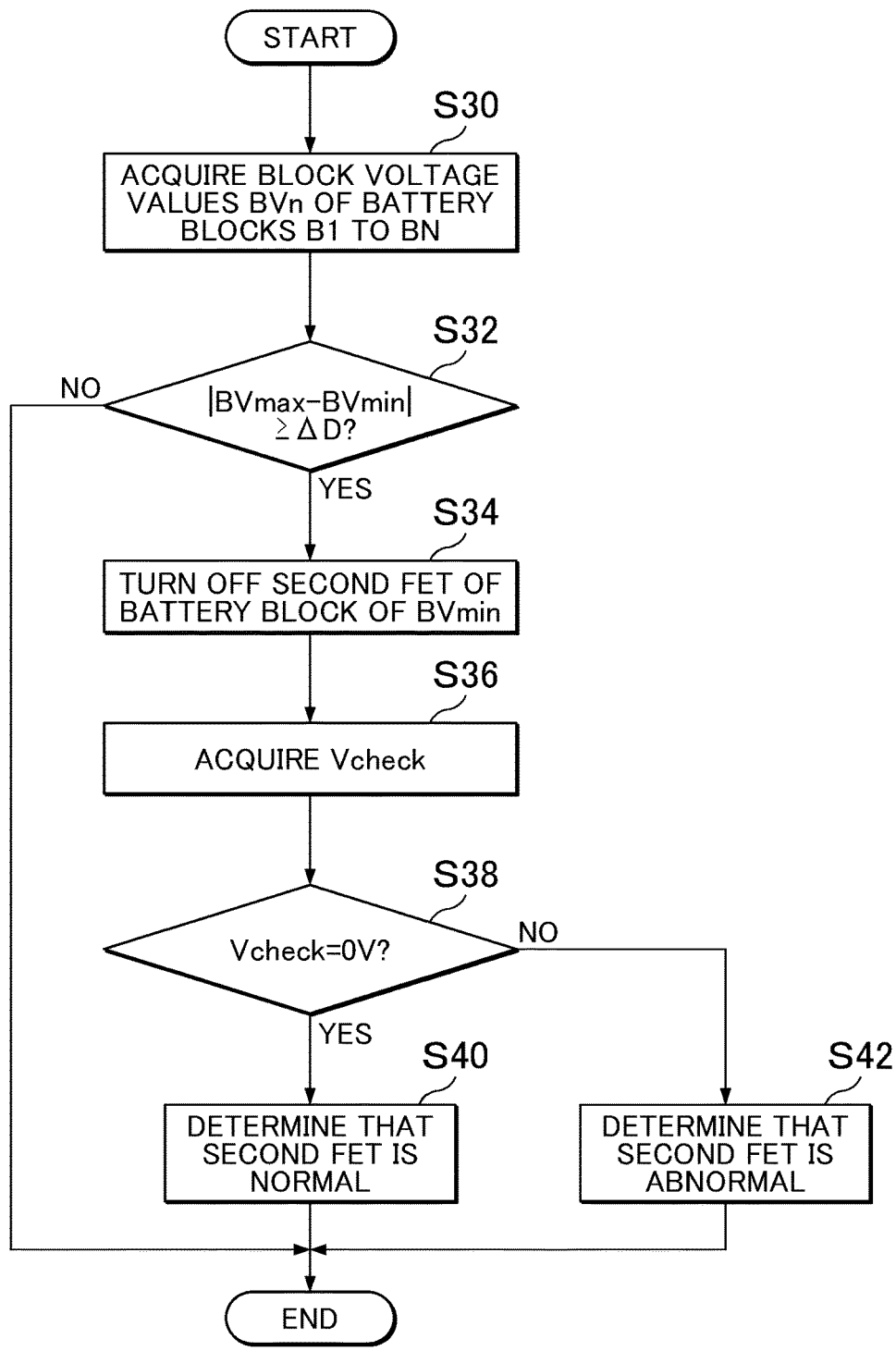
FIG. 6 is a flowchart illustrating a flow of failure detection of the second FET.

FIG. 6 is a flowchart illustrating a flow of the determination of the presence or absence of the ON failure in the failure detection circuit. In the event of the ON failure of the second FET 38, the corresponding battery block Bn continues to be discharged. Accordingly, the voltage value thereof is considered to undergo a significant reduction. In this regard, in the case of the determination of the presence or absence of the ON failure, the presence or absence of the battery block Bn subjected to an excessive voltage drop is checked first.

Specifically, during the determination of the presence or absence of the ON failure, the controller 18 first acquires the respective block voltage values BVn of all the battery blocks Bn (S30). Then, the controller 18 determines whether or not a deviation $\Delta BV$ between the maximum block voltage value BVmax and the minimum block voltage value BVmin of the plurality of obtained block voltage values BVn is at least a specified threshold ΔD (S32). The threshold ΔD is set based on the amount of the variation in the self-discharge amounts of the respective battery cells Ci, the amount of the variation in the current consumptions by the ICs 34, and the like.

In a case where the deviation ΔBV is less than the threshold ΔD, no battery block Bn is considered to be subjected to the significant reduction in the block voltage value BVn. Accordingly, the processing is terminated with a determination of the non-occurrence of the ON failure. In a case where the deviation ΔBV is at least the threshold ΔD, there is a possibility that the ON failure has occurred. Then, a determination is performed of the presence or absence of a failure of the second FET 38 corresponding to the battery block Bn with the most reduced block voltage value BVn, that is, the battery block Bn having the minimum block voltage value BVmin. Specifically, the controller 18 acquires the detected voltage Vcheck while sending a signal for turning OFF the second FET 38 corresponding to the battery block Bn with the least block voltage value BVn (S34, S36). Then, the controller 18 determines whether or not the obtained detected voltage Vcheck is 0 V (S38). In a case where the second FET 38 is in normal operation, the second FET 38 is turned OFF in accordance with a control signal of the controller 18 and Vcheck becomes 0 V. In the case of the ON failure of the second FET 38, the second FET 38 remains in the ON state and Vcheck is 5 V regardless of the control signal of the controller 18. Accordingly, in a case where Vcheck is 0 V, the controller 18 determines that the second FET 38 is normal (S40). In a case where Vcheck is not 0 V, the controller 18 determines that the second FET 38 is subjected to the ON failure and outputs an error (S42).

As is apparent from the above description, this failure detection circuit allows the ON failure of the second FET 38 to be detected. In addition, this failure detection circuit can be obtained by simply the three resistor elements Ra, Rb, Rc being added to the circuit which is illustrated in FIG. 2, and thus can be realized with little additional cost.

Figure 7:
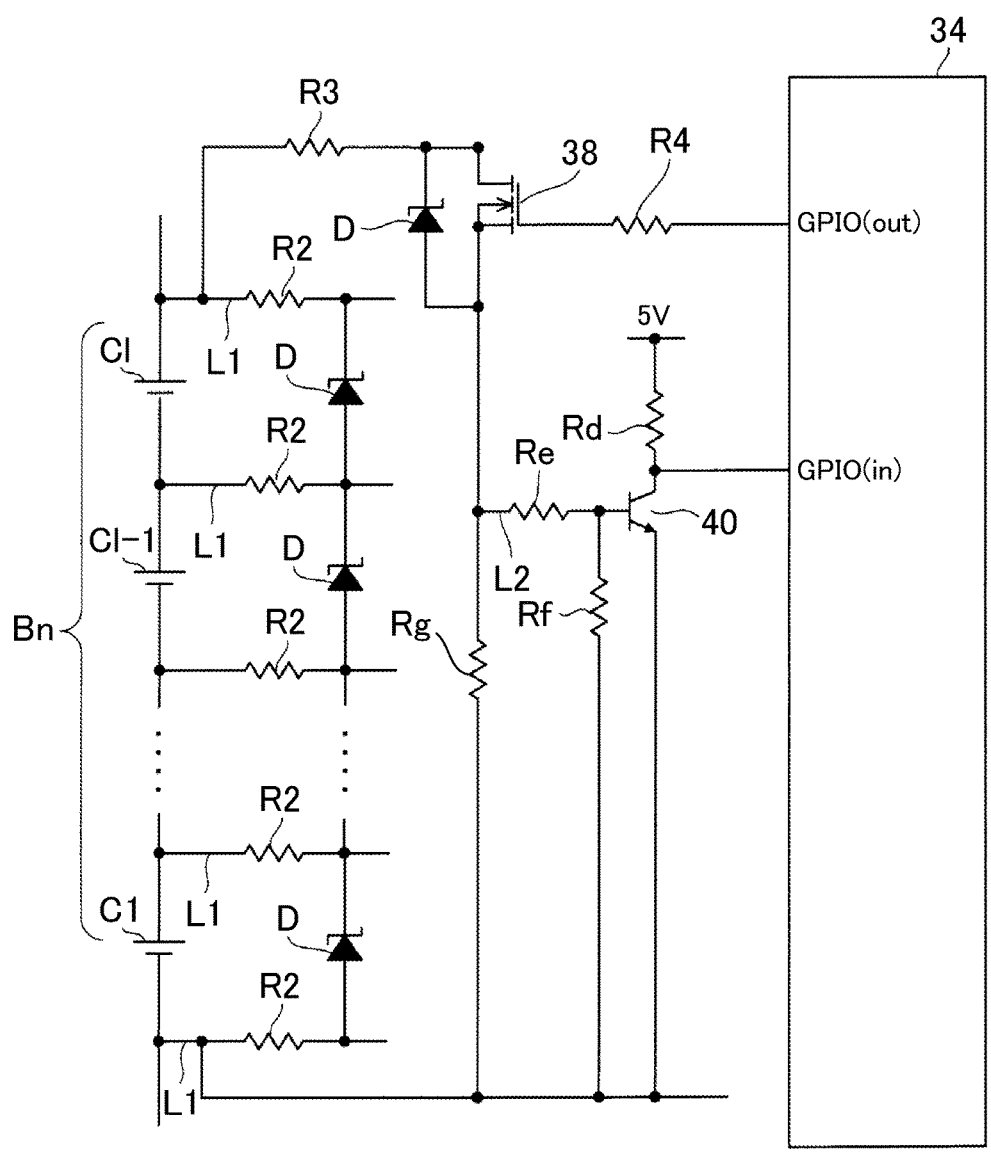
FIG. 7 is a drawing illustrating another example of the failure detection configuration of the second FET.

FIG. 7 is a diagram illustrating another example of the failure detection circuit of the second FET 38. This failure detection circuit can detect the leak failure as well as the ON failure of the second FET 38. This failure detection circuit is connected to a 5 V electric power supply and has a detection circuit that connects a resistor element Rd and a transistor 40 in series to each other. A collector of the transistor 40 is connected to a GPIO input of the IC 34. The IC 34 compares an input voltage and a specified threshold to each other and outputs Lo or Hi to the controller 18.

A resistor element Rg is connected to a source of the second FET 38. An input line L2 is connected to a connection point of the source and the resistor element Rg. The input line L2 is connected to a base of the transistor 40 via an input resistance Re. A resistor element Rf is arranged between the base and an emitter of the transistor 40.

In the detection circuit that has the above-described configuration, the transistor 40 is turned ON by the second FET 38 becoming ON or leaking and a current flowing through the input line L2 and the transistor 40 is turned OFF when no current flows through the input line L2. In other words, the transistor 40 of the detection circuit is a third switching element that is turned ON depending on the current flowing through the second FET 38. The IC 34 outputs Lo as an output value Sout when the transistor 40 is ON or leaks and output Hi as the output value Sout when the transistor 40 is OFF.

Figure 8:
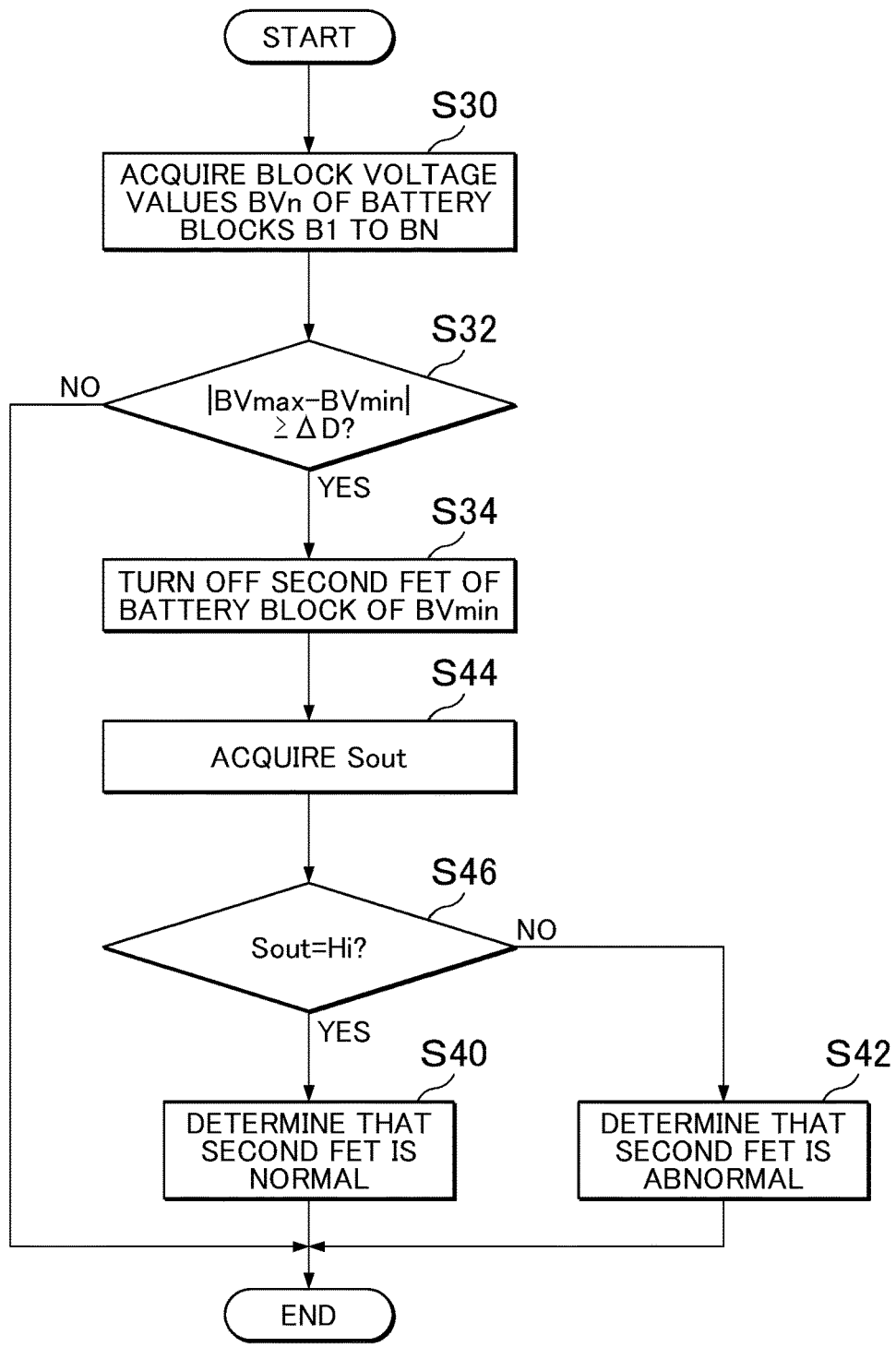
FIG. 8 is a flowchart illustrating another flow of the failure detection of the second FET.

FIG. 8 is a flowchart illustrating a flow of a determination of the presence or absence of a failure in this failure detection circuit. The flow of the processing pertaining to this case is almost identical to the flow that is illustrated in FIG. 6. In other words, during the determination of the presence or absence of the failure, the controller 18 first acquires the respective block voltage values BVn of all the battery blocks Bn (S30). Then, the controller 18 determines whether or not the deviation ΔBV between the maximum block voltage value BVmax and the minimum block voltage value BVmin of the plurality of obtained block voltage values BVn is at least the specified threshold ΔD (S32).

In a case where the deviation ΔBV is less than the threshold ΔD, the processing is terminated with a determination of the non-occurrence of the ON failure and the non-occurrence of the leak failure. In a case where the deviation ΔBV is at least the threshold ΔD, the controller 18 sends a signal for turning OFF the second FET 38 corresponding to the battery block Bn with the least block voltage value BVn while acquiring the output value Sout in that case (S44). Then, the controller 18 determines whether or not the obtained output value Sout is Hi (S46). In a case where the second FET 38 is in normal operation, the second FET 38 is turned OFF in accordance with a control signal of the controller 18 and the output value Sout from the IC 34 becomes Hi. In the case of the ON failure or the leak failure of the second FET 38, the second FET 38 remains in the ON state or a leak state and Sout is Lo regardless of the control signal of the controller 18. Accordingly, in a case where Sout is Hi, the controller 18 determines that the second FET 38 is normal (S40). In a case where Sout is not Hi, the controller 18 determines that the second FET 38 is subjected to the ON failure and outputs an error (S42).

As is apparent from the above description, the leak failure as well as the ON failure of the second FET 38 can be detected with this failure detection circuit. In addition, when the failure detection circuit illustrated in FIG. 5 or 7 is disposed, it can be clearly distinguished whether a significant reduction in the block voltage value is attributable to a failure of the battery cell Ci or a failure of the second FET 38.

What is claimed is:

1. A battery monitoring device monitoring a battery unit that comprises a plurality of battery blocks connected to each other in series, each of the plurality of battery blocks comprising a plurality of battery cells connected to each other in series, the battery monitoring device comprising:

a voltage detection circuit connected to the plurality of battery cells via a plurality of voltage detection lines and configured to detect voltages of the plurality of battery cells;

a first equalization circuit comprising at least a first switching element, disposed for each of the plurality of battery cells and connected in parallel to a corresponding one of the plurality of battery cells so as to equalize the respective voltages of the plurality of battery cells;

a plurality of overcurrent prevention resistors disposed on the respective plurality of voltage detection lines between the plurality of battery cells and the first equalization circuit;

a second equalization circuit comprising at least a second switching element, disposed for each of the plurality of battery blocks and connected in parallel to a corresponding one of the plurality of battery blocks so as to equalize respective voltages of the plurality of battery blocks; and a controller configured to control driving of the first and second switching elements, a voltage-dividing circuit connected in parallel to the second switching element and configured to output a first voltage value proportional to a voltage between two terminals of the second switching element, wherein the second equalization circuit is disposed on a side of the plurality of battery blocks, and wherein the controller is further configured to turn off the second switching element by sending a signal to the second switching element, and determine presence or absence of a failure of the second switching element by comparing a second voltage value output from the voltage-dividing circuit with a predetermined value, the second voltage value being detected after the controller turns off the second switching element.

2. The battery monitoring device according to claim 1, further comprising:

an integrated circuit (IC) disposed for each of the plurality of battery blocks and comprising the voltage-detection circuit, wherein the second switching element is an external switching element attached outside the IC.

3. The battery monitoring device according to claim 2, wherein the first switching element is a built-in switching element built into the IC.

4. The battery monitoring device according to claim 1, further comprising:

a detection circuit including a third switching element that is turned on by a current flowing through the second switching element, wherein the controller is further configured to determine presence or absence of a failure of the second switching element based on a voltage output from the detection circuit.

5. The battery monitoring device according to claim 1, wherein the voltage-dividing circuit comprises a first resistor and a second resistor that are connected in series to each other, and the second switching element is connected in parallel to the series-connected first resistor and second resistor.

\* \* \* \* \*